United States Patent [19]
Robb et al.

[11] Patent Number: 5,945,868
[45] Date of Patent: Aug. 31, 1999

[54] POWER SEMICONDUCTOR DEVICE AND METHOD FOR INCREASING TURN-ON TIME OF THE POWER SEMICONDUCTOR DEVICE

[75] Inventors: Stephen Paul Robb, Tempe; Zheng Shen, Chandler, both of Ariz.; Kim Roger Gauen, Noblesville, Ind.

[73] Assignee: Motorola, Inc., Schaumburg, Ill.

[21] Appl. No.: 09/004,656

[22] Filed: Jan. 8, 1998

[51] Int. Cl.$^6$ .................................................. H03K 17/60
[52] U.S. Cl. .......................... 327/482; 327/379; 327/398; 327/489; 323/275
[58] Field of Search .................................. 323/273, 275; 327/379, 388, 398, 482, 489

[56] References Cited

U.S. PATENT DOCUMENTS

| | | | |
|---|---|---|---|
| 4,959,565 | 9/1990 | Knecht et al. ........................... | 307/542 |
| 5,231,311 | 7/1993 | Ferry et al. ............................. | 307/443 |
| 5,349,247 | 9/1994 | Hush et al. ............................. | 327/379 |
| 5,365,099 | 11/1994 | Phipps et al. .......................... | 257/328 |
| 5,410,262 | 4/1995 | Kang ....................................... | 327/379 |
| 5,734,277 | 3/1998 | Hu et al. ................................. | 327/108 |

*Primary Examiner*—Tim Callahan
*Assistant Examiner*—Jung Ho Kim
*Attorney, Agent, or Firm*—Anthony M. Martinez; Rennie William Dover

[57] ABSTRACT

A power semiconductor device (10) and a method for increasing the turn-on time of the power semiconductor device (10). The power semiconductor device (10) has a first stage (13) and a second stage (14), where the transconductance of the first stage (13) is less than the transconductance of the second stage (14). The turn-on time of the power semiconductor device (10) is increased by turning on the first stage (13) before turning on the second stage (14).

18 Claims, 1 Drawing Sheet

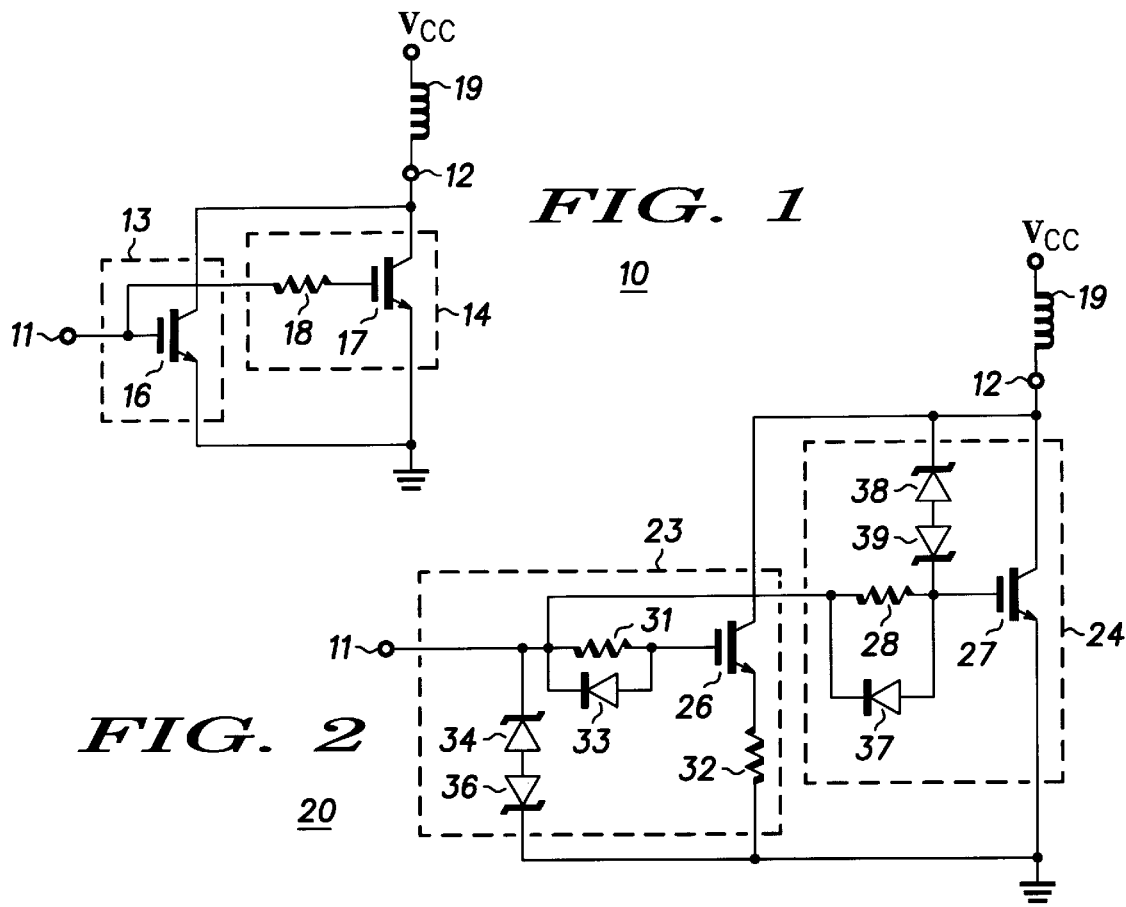
*FIG. 1*
*FIG. 2*
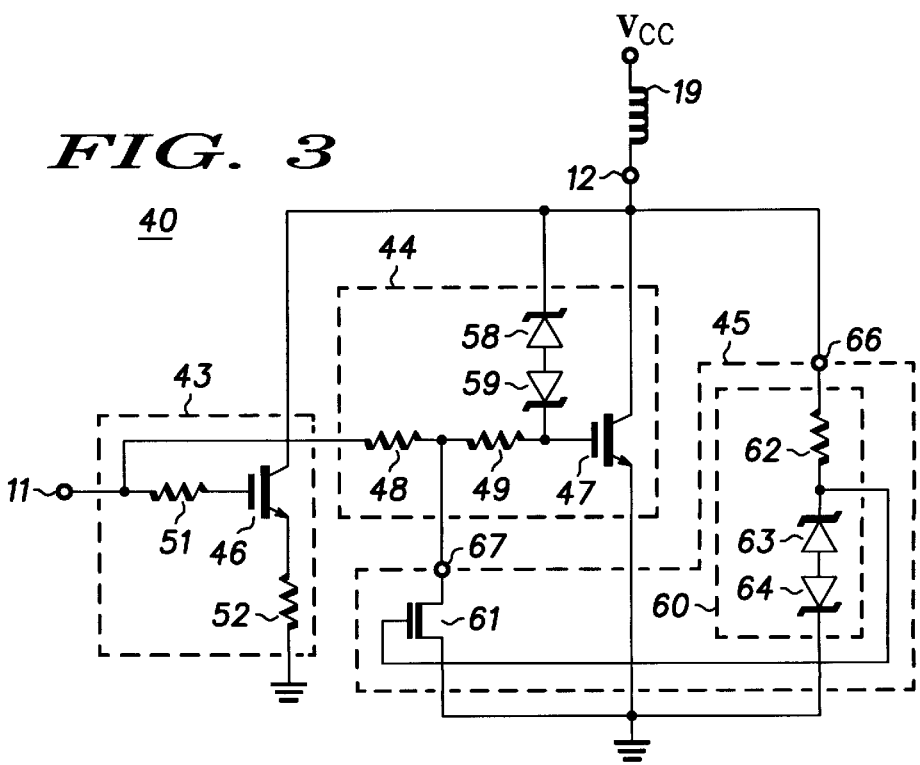
*FIG. 3*

# POWER SEMICONDUCTOR DEVICE AND METHOD FOR INCREASING TURN-ON TIME OF THE POWER SEMICONDUCTOR DEVICE

BACKGROUND OF THE INVENTION

The present invention relates, in general, to semiconductor devices and, more particularly, to power semiconductor devices.

Ignition systems typically include power semiconductor devices such as power Metal Oxide Semiconductor Field Effect Transistors (MOSFETs) to generate high voltages at the spark plug of the ignition system. In general, the power MOSFET is coupled to the spark plug via a transformer. The drain of the power MOSFET is connected to the primary coil of the transformer and the secondary coil of the transformer is connected to the spark plug. In addition, the primary coil is coupled for receiving a supply voltage or a battery voltage.

When the power MOSFET is on, the voltage at the secondary coil is a predicted value equal to approximately the battery voltage multiplied by the turns ratio of the transformer. When the power MOSFET is switched on and then switched off, the energy stored in the transformer causes the drain voltage of the power MOSFET to rise substantially higher than the battery voltage. This creates an increase in the voltage at the primary coil of the transformer that results in an increase in the voltage at the secondary coil of the transformer. A spark is produced by the spark plug when the voltage at the secondary coil increases to a level higher than a threshold voltage of the spark plug.

A potential problem known as "spark-on-make" can occur when the power MOSFET is initially turned on. "Spark-on-make" is caused by the voltage drop at the drain of the power MOSFET resonating because of the leakage inductance of the transformer, the parasitic capacitance of the transformer, and the parasitic capacitance of the spark plug to produce a voltage at the secondary coil that exceeds the threshold voltage of the spark plug. The resonating has a ringing effect or oscillation where the voltage at the secondary coil overshoots the predicted value of voltage at the secondary coil. This overshoot voltage can generate an undesirable spark when the power MOSFET is initially turned on.

Previously, a technique for preventing "spark-on-make" in an ignition system included adding a blocking diode in series with the spark plug. Problems with this technique include the cost of the blocking diode, the reliability of the blocking diode, and the added space for the blocking diode. Another technique used to prevent "spark-on-make" included reducing the turns ratio of the transformer. A disadvantage of this technique is that a higher voltage at the primary coil is needed to generate the threshold voltage of the spark plug at the secondary coil. Therefore, a higher voltage power semiconductor device requiring more die area is typically used to generate the higher voltage at the primary coil.

Accordingly, it would be advantageous to have a power semiconductor device and a method for preventing "spark-on-make". It would be of further advantage for the power semiconductor device to be cost efficient and reliable.

BRIEF DESCRIPTION OF THE DRAWINGS

FIG. 1 is a schematic diagram of a power semiconductor device in accordance with a first embodiment of the present invention;

FIG. 2 is a schematic diagram of a power semiconductor device in accordance with a second embodiment of the present invention; and FIG. 3 is a schematic diagram of a power semiconductor device in accordance with a third embodiment of the present invention.

DETAILED DESCRIPTION OF THE DRAWINGS

Generally, the present invention provides a power semiconductor device or circuit and a method for increasing the turn-on time of the power semiconductor device. More particularly, the present invention provides a power semiconductor device having at least two stages for increasing the turn-on time of the power semiconductor device. The turn-on time of a power semiconductor device in accordance with the present invention is increased when compared to a typical power semiconductor device that includes a single stage. In systems where the power semiconductor device is coupled to an inductive load such as a transformer, the semiconductor device of the present invention limits the change in voltage with respect to time (dv/dt) at the primary coil of the transformer when the power semiconductor device is initially turned on. This reduces the undesirable overshoot voltage and oscillation at the secondary coil of the transformer. Limiting the dv/dt at the primary coil is accomplished by increasing the turn-on time of the power semiconductor device.

FIG. 1 is a schematic diagram of a power semiconductor device 10 in accordance with a first embodiment of the present invention. Power semiconductor device 10 has an input terminal 11 and an output terminal 12. Further, power semiconductor device 10 has a first stage 13 and a second stage 14. More particularly, first stage 13 is comprised of a transistor 16 and second stage 14 is comprised of a transistor 17 and a resistor 18. By way of example, transistors 16 and 17 are Insulated Gate Bipolar Transistors (IGBTs), each having a gate, a collector, and an emitter. Input terminal 11 is commonly connected to the gate of IGBT 16 and the first terminal of resistor 18. The collector of IGBT 16 is connected to output terminal 12 and the emitter of IGBT 16 is coupled for receiving a power supply voltage such as, for example, ground. The gate of IGBT 17 is connected to the second terminal of resistor 18, the collector of IGBT 17 is connected to output terminal 12, and the emitter of IGBT 17 is coupled for receiving a power supply voltage such as, for example, ground. Although transistors 16 and 17 are described as IGBTs, this is not a limitation of the present invention. Transistors 16 and 17 can be Metal Oxide Semiconductor Field Effect Transistors (MOSFETs), bipolar transistors, thyristors, or the like. It should be noted that the gate of a Field Effect Transistor (FET) is referred to as a control electrode and the drain and the source of a FET are referred to as current carrying electrodes. Likewise, the base of a bipolar transistor is referred to as a control electrode and the collector and the emitter of a bipolar transistor are referred to as current carrying electrodes. Similarly, the gate of an IGBT is referred to as a control electrode and the collector and the emitter of an IGBT are referred to as current carrying electrodes.

FIG. 1 further illustrates power semiconductor device 10 connected to an inductive load 19. The first terminal of inductive load 19 is connected to output terminal 12 and the second terminal of inductive load 19 is coupled for receiving a power supply voltage such as, for example, voltage Vcc.

In operation, input terminal 11 is coupled for receiving a control signal. First stage 13 and second stage 14 cooperate to switch the voltage across inductive load 19. The voltage at output terminal 12 can be switched between approximately ground and a value substantially greater than the voltage Vcc. When the voltage of the control signal is less than the threshold voltages of IGBTs 16 and 17, IGBTs 16 and 17 are off and the voltage at output terminal 12 is approximately equal to the voltage Vcc. As the voltage of the control signal is increased to a value greater than the threshold voltages of IGBTs 16 and 17, these transistors turn on. When IGBTs 16 and 17 turn on, the voltage at output terminal 12 falls from approximately the voltage Vcc to the voltage drop between the collector and the emitter of IGBT 17, i.e., Vceon. The time it takes for the voltage at output terminal 12 to change from approximately the voltage Vcc to the voltage Vceon is referred to as the fall time of the voltage at output terminal 12 or the turn-on time of power semiconductor device 10.

IGBT 16 turns on before IGBT 17 as a result of resistor 18 and the input capacitance of IGBT 17. Preferably, the transconductance of IGBT 16 is less than the transconductance of IGBT 17. Since the transconductance of IGBT 16 is less than the transconductance of IGBT 17 and IGBT 16 turns on before IGBT 17, the voltage at output terminal 12 is lowered at a slower rate compared to a power semiconductor device comprising only a single IGBT. In other words, the fall time of the voltage at output terminal 12 is increased by IGBT 16 turning on before IGBT 17 and IGBT 16 discharging the output capacitance of IGBT 17 and the parasitic capacitance of inductive load 19. Preferably, resistor 18 is chosen so that IGBT 16 turns on approximately 10 to 100 micro-seconds before IGBT 17.

When the voltage of the control signal is decreased to a value below the threshold voltages of IGBTs 16 and 17, IGBTs 16 and 17 turn off. The energy stored in inductive load 19 causes the voltage at output terminal 12 to rise above the voltage Vcc. The voltage at output terminal 12 rises to a level equal to the collector-emitter avalanche voltage of IGBT 16 and IGBT 17 and the energy stored in inductive load 19 is discharged via IGBT 16 and IGBT 17.

Although power semiconductor device 10 is illustrated as having two stages, this is not a limitation of the present invention. Power semiconductor device 10 can have two or more stages where stages are added preceding first stage 13. In addition, each preceding stage includes a transistor having a lower transconductance than the transconductance of the transistor of second stage 14.

FIG. 2 is a schematic diagram of a power semiconductor device 20 in accordance with a second embodiment of the present invention. It should be understood that the same reference numerals are used in the figures to denote the same elements. Power semiconductor device 20 includes input terminal 11, output terminal 12, a first stage 23, and a second stage 24. Power semiconductor device 20 is similar to power semiconductor device 10 (FIG. 1) in that the turn-on time of power semiconductor device 20 is increased by turning on first stage 23 before turning on second stage 24.

First stage 23 is comprised of a transistor 26, resistors 31 and 32, and diodes 33, 34, and 36. Second stage 24 is comprised of a transistor 27, a resistor 28, and diodes 37, 38, and 39. By way of example, transistors 26 and 27 are IGBTs, wherein the transconductance of IGBT 26 is less than the transconductance of IGBT 27. In accordance with the second embodiment, diodes 34, 36, 38, and 39 are Zener diodes.

Input terminal 11 is commonly connected to the cathode of diode 33, the cathode of diode 34, the first terminal of resistor 31, the first terminal of resistor 28, and the cathode of diode 37. The anode of diode 34 is connected to the anode of diode 36 and the cathode of diode 36 is coupled for receiving a power supply voltage such as, for example, ground. The gate of IGBT 26 is commonly connected to the second terminal of resistor 31 and the anode of diode 33. Therefore, resistor 31 is parallel to diode 33. The emitter of IGBT 26 is connected to the first terminal of resistor 32 and the second terminal of resistor 32 is coupled for receiving a power supply voltage such as, for example, ground. The collector of IGBT 26 is connected to output terminal 12. The gate of IGBT 27 is commonly connected to the second terminal of resistor 28, the anode of diode 37, and the cathode of diode 39. Accordingly, resistor 28 is parallel to diode 37. The anode of diode 39 is connected to the anode of diode 38 and the cathode of diode 38 is connected to output terminal 12. The collector of IGBT 27 is connected to output terminal 12 and the emitter of IGBT 27 is coupled for receiving a power supply voltage such as, for example, ground.

The operation of resistor 28 and IGBTs 26 and 27 in response to the control signal received at input terminal 11 is similar to the operation of resistor 18 (FIG. 1) and IGBTs 16 and 17 (FIG. 1), respectively. The fall time of the voltage at output terminal 12 is increased by IGBT 26 turning on before IGBT 27 and IGBT 26 discharging the output capacitance of IGBT 27. Preferably, resistor 28 is chosen so that IGBT 26 turns on approximately 100 micro-seconds before IGBT 27. Diodes 34 and 36 provide protection from large overvoltages appearing at input terminal 11. Diodes 38 and 39 clamp the voltage at output terminal 12. Diodes 38 and 39 are also referred to as clamp diodes. The clamp voltage of output terminal 12 is approximately equal to the reverse breakdown voltage of diode 38 and the forward voltage drop of diode 39. Diodes 38 and 39 are chosen so that the reverse breakdown voltage of diode 38 and the forward voltage drop of diode 39 are less than the avalanche voltage of IGBT 27. Therefore, when IGBTs 26 and 27 are turned on and then turned off, the energy stored in inductive load 19 causes output terminal 12 to rise to a voltage approximately equal to the clamp voltage at output terminal 12. Resistor 31 increases the turn-on time of IGBT 26. Resistor 32 is added to further lower the transconductance of IGBT 26. Diodes 33 and 37 are used to reduce the turn-off time of IGBTs 26 and 27.

FIG. 3 is a schematic diagram of a power semiconductor device 40 in accordance with a third embodiment of the present invention. Power semiconductor device 40 includes input terminal 11, output terminal 12, a first stage 43, a second stage 44, and a control circuit 45. Power semiconductor device 40 is similar to power semiconductor device 20 in that the turn-on time of power semiconductor device 40 is increased by turning on first stage 43 before turning on second stage 44.

First stage 43 is comprised of a transistor 46 and resistors 51 and 52. Input terminal 11 is connected to the first terminal of resistor 51. The gate of IGBT 46 is connected to the second terminal of resistor 51 and the collector of IGBT 46 is connected to output terminal 12. The emitter of IGBT 46 is connected to the first terminal of resistor 52 and the second terminal of resistor 52 is coupled for receiving a power supply voltage such as, for example, ground.

Second stage 44 is comprised of a transistor 47, resistors 48 and 49, and diodes 58 and 59. Input terminal 11 is connected to the first terminal of resistor 48 and the second terminal of resistor 48 is connected to the first terminal of resistor 49. The gate of IGBT 47 is commonly connected to the second terminal of resistor 49 and the cathode of diode 59. The anode of diode 59 is connected to the anode of diode 58 and the cathode of diode 58 is connected to output terminal 12. The collector of IGBT 47 is connected to output terminal 12 and the emitter of IGBT 47 is coupled for receiving a power supply voltage such as, for example, ground.

Control circuit 45 is comprised of a sensor circuit 60 and a switch 61. By way of example, switch 61 is an N-channel FET having a gate, a drain, and a source. Sensor circuit 60 is comprised of a resistor 62 and diodes 63 and 64. The first terminal of resistor 62 is connected to the input of sensor circuit 60 and the second terminal of resistor 62 is connected to the output of sensor circuit 60. The cathode of diode 63 is connected to the output of sensor circuit 60 and the anode of diode 63 is connected to the anode of diode 64. The cathode of diode 64 is coupled for receiving a power supply voltage such as, for example, ground. The input of sensor circuit 60 is connected to a monitor input 66 of control circuit 45 and the output of sensor circuit 60 is connected to the gate of FET 61. The drain of FET 61 is connected to a control output 67 of control circuit 45 and the source of FET 61 is coupled for receiving a power supply voltage such as, for example, ground. Monitor input 66 is connected to output terminal 12 and control output 67 is connected to the second terminal of resistor 48.

Preferably, transistors 46 and 47 are IGBTs, wherein the transconductance of IGBT 46 is less than the transconductance of IGBT 47. Further, diodes 58, 59, 63, and 64 are Zener diodes.

The operation of resistor 48 and IGBTs 46 and 47 in response to the control signal received at input terminal 11 is similar to the operation of resistor 28 (FIG. 2) and IGBTs 26 and 27 (FIG. 2), respectively. The fall time of the voltage at output terminal 12 is increased by IGBT 46 turning on before IGBT 47 and IGBT 46 discharging the output capacitance of IGBT 47. Preferably, resistor 48 is chosen so that IGBT 46 turns on approximately 10 to 100 micro-seconds before IGBT 47. Resistor 51 increases the turn-on time of IGBT 46 and resistor 52 is added to further lower the transconductance of IGBT 46. Resistors 51 and 52 are not limitations of the present invention. Diodes 58 and 59 clamp the voltage at output terminal 12. When diodes 58 and 59 are conducting current, resistor 49 limits the current provided to FET 61. Diodes 58 and 59 and resistor 49 are not limitations of the present invention. If clamping of the voltage at output terminal 12 is not needed, diodes 58 and 59 and resistor 49 may be absent.

Monitor input 66 monitors the voltage at output terminal 12 and control output 67 turns on second stage 44 in accordance with the voltage at output terminal 12. More particularly, the output of sensor circuit 60 controls FET 61 by monitoring the voltage at output terminal 12. The voltage at output terminal 12 is also referred to as the output voltage of power semiconductor device 40. FET 61 controls the turn-on of IGBT 47 and has a threshold voltage substantially less than the voltage Vcc.

When the voltage of the control signal received at input terminal 11 has a value greater than the threshold voltages of IGBTs 46 and 47, IGBT 46 turns on and begins discharging the output capacitance of IGBT 47 and the parasitic capacitance of inductive load 19 to lower the voltage at output terminal 12 from the voltage Vcc. While the voltage at output terminal 12 is greater than or equal to the threshold voltage of FET 61, FET 61 is on and prevents IGBT 47 from turning on. When the voltage at output terminal 12 falls to a value less than the threshold voltage of FET 61, FET 61 turns off and IGBT 47 turns on. When the voltage of the control signal is decreased to a value below the threshold voltages of IGBTs 46 and 47, the energy stored in inductive load 19 causes the voltage at output terminal 12 to rise to a value approximately equal to the clamp voltage of clamp diodes 58 and 59. The reverse breakdown voltage of diode 63 and the forward voltage drop of diode 64 is chosen to protect the gate oxide of FET 61 from the clamp voltage of diodes 58 and 59. Resistor 62 limits the current generated by the clamp voltage at output terminal 12 so that the clamp voltage is discharged via IGBT 47.

By now it should be appreciated that a power semiconductor device and a method for increasing the turn-on time of the power semiconductor device is provided. An advantage of the present invention is that it can be used in ignition systems and reduce the overshoot voltage at the secondary coil of the transformer, thereby preventing problems such as "spark-on-make". Further, the present invention eliminates the need for a blocking diode at the secondary coil of the transformer. Another advantage of the present invention is that it can be manufactured using standard semiconductor processing techniques.

We claim:

1. A power semiconductor device, comprising:
    a first transistor having a control electrode, a first current carrying electrode, and a second current carrying electrode;
    a second transistor having a control electrode, a first current carrying electrode coupled to the first current carrying electrode of the first transistor, and a second current carrying electrode coupled to the second current carrying electrode of the first transistor;
    a first resistor having a first terminal coupled to the control electrode of the second transistor and a second terminal coupled to the control electrode of the first transistor;
    a first diode having a cathode coupled to the first current carrying electrode of the first transistor and an anode; and
    a second diode having an anode coupled to the anode of the first diode and a cathode coupled to the control electrode of the first transistor.

2. The power semiconductor device of claim 1, wherein a transconductance of the second transistor is less than a transconductance of the first transistor.

3. The power semiconductor device of claim 1, wherein the first diode and the second diode are Zener diodes.

4. The power semiconductor device of claim 1, further comprising:
    a second resistor having a first terminal coupled to the control electrode of the second transistor and a second terminal coupled to an input terminal of the power semiconductor devices; and
    a third resistor that couples the second current carrying electrode of the second transistor to the second current carrying electrode of the first transistor.

5. The power semiconductor device of claim 1, further comprising a diode having an anode coupled to the second terminal of the first resistor and a cathode coupled to the first terminal of the first resistor.

6. The power semiconductor device of claim 1, further comprising:
    a third diode having a cathode coupled to the control electrode of the second transistor and an anode; and
    a fourth diode having an anode coupled to the anode of the third diode and a cathode coupled to the second current carrying electrode of the second transistor.

7. The power semiconductor device of claim 6, wherein the third and fourth diodes are Zener diodes.

8. The power semiconductor device of claim 1, wherein the first transistor and the second transistor are Insulated Gate Bipolar Transistors (IGBTs).

9. A power semiconductor device, comprising:

a first transistor having a control electrode, a first current carrying electrode, and a second current carrying electrode coupled for receiving a power supply voltage;

a second transistor having a control electrode, a first current carrying electrode coupled to the first current carrying electrode of the first transistor, and a second current carrying electrode coupled for receiving the power supply voltage;

a first resistor having a first terminal coupled to the control electrode of the second transistor and a second terminal coupled to the control electrode of the first transistor; and a control circuit having a monitor input coupled to the first current carrying electrode of the first transistor and a control output coupled to the second terminal of the first resistor.

10. The power semiconductor device of claim 9, wherein a transconductance of the second transistor is less than a transconductance of the first transistor.

11. The power semiconductor device of claim 9, wherein the first transistor and the second transistor are Insulated Gate Bipolar Transistors (IGBTs).

12. The power semiconductor device of claim 9, wherein the control circuit comprises:

a sensor circuit having an input coupled to the monitor input of the control circuit and an output; and a third transistor having a control electrode coupled to the output of the sensor circuit, a first current carrying electrode coupled to the control output of the control circuit, and a second current carrying electrode coupled for receiving the power supply voltage.

13. The power semiconductor device of claim 12, wherein the sensor circuit comprises:

a second resistor having a first terminal coupled to the input of the sensor circuit and a second terminal coupled to the output of the sensor circuit;

a first diode having a cathode coupled to the output of the sensor circuit and an anode; and a second diode having an anode coupled to the anode of the first diode and a cathode coupled for receiving the power supply voltage.

14. The power semiconductor device of claim 12, wherein the third transistor is an N-channel Field Effect Transistor (FET).

15. The power semiconductor device of claim 9, further comprising:

a second resistor having a first terminal coupled to the control electrode of the second transistor and a second terminal; and a third resistor, wherein the second current carrying electrode of the second transistor is coupled for receiving the power supply voltage via the third resistor.

16. The power semiconductor device of claim 9, further comprising:

a first diode having a cathode coupled to the first current carrying electrode of the first transistor and an anode;

a second diode having an anode coupled to the anode of the first diode and a cathode coupled to the control electrode of the first transistor; and a second resistor, wherein the second terminal of the first resistor is coupled to the control electrode of the first transistor via the second resistor.

17. A method for increasing a turn-on time of a power semiconductor device, comprising the steps of:

providing the power semiconductor device having a first stage and a second stage, wherein a transconductance of the first stare is less than a transconductance of the second stage;

turning on the first stage of the power semiconductor device before turning on the second stage of the power semiconductor device;

monitoring an output voltage of the power semiconductor device;

lowering the output voltage of the power semiconductor device with the first stage of the power semiconductor device; and turning on the second stage of the power semiconductor device in accordance with the output voltage of the power semiconductor device.

18. The method of claim 17, wherein the step of turning on the first stage of the power semiconductor device before turning on the second stage of the power semiconductor device includes turning on the first stage of the power semiconductor device 100 micro-seconds before turning on the second stage of the power semiconductor device.

* * * * *